(12) United States Patent
Ohtsuki

(10) Patent No.: US 7,320,604 B2
(45) Date of Patent: Jan. 22, 2008

(54) ELECTRONIC CIRCUIT MODULE AND METHOD FOR FABRICATION THEREOF

(75) Inventor: Terukazu Ohtsuki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/598,759

(22) Filed: Nov. 14, 2006

(65) Prior Publication Data
US 2007/0178729 A1    Aug. 2, 2007

(30) Foreign Application Priority Data
Jan. 31, 2006    (JP)    ............................. 2006-021728

(51) Int. Cl.
*H01R 12/00*    (2006.01)
(52) U.S. Cl. ........................ 439/69; 361/772
(58) Field of Classification Search .................. 439/55, 439/65, 68, 69, 83, 936; 361/772, 783
See application file for complete search history.

(56) References Cited
U.S. PATENT DOCUMENTS
4,558,397 A * 12/1985 Olsson ........................ 361/772
4,814,295 A * 3/1989 Mehta ........................... 29/840
5,081,520 A * 1/1992 Yoshii et al. ................ 257/702

FOREIGN PATENT DOCUMENTS
JP    2003-60523    2/2003

* cited by examiner

*Primary Examiner*—Khiem Nguyen
(74) *Attorney, Agent, or Firm*—Nixon & Vanderhye, P.C.

(57) ABSTRACT

Provided is an electronic circuit module using a board having no cavity and a method for efficiently fabricating it. Electronic components are mounted on the front face of a module board 1, and an LSI chip 5 is die-bonded on the bottom face thereof in a bare-chip state with gold wires 8. Around the LSI chip 5, metal blocks 9 made of copper are mounted by soldering. The LSI chip 5, the gold wires 8, and the metal blocks 9 provided on the bottom face of the module board 1 are sealed with resin 10 with a motherboard-facing face 9a of each metal block 9 and a face 18 thereof flush with the corresponding side face of the module board 1 exposed from the resin 10. These exposed portions serve as electrode terminals when the module 11 is soldered to a motherboard. The module board 1 is obtained by cutting a sheet circuit board into individual unit module boards 1.

26 Claims, 10 Drawing Sheets

ELECTRONIC CIRCUIT MODULE AND METHOD FOR FABRICATION THEREOF

This nonprovisional application claims priority under 35 U.S.C. § 119(a) on Patent Application No. 2006-021728 filed in Japan on Jan. 31, 2006, the entire contents of which are hereby incorporated by reference.

BACKGROUND OF THE INVENTION

1. Field of the Invention

The present invention relates to a miniaturized electronic circuit module to be mounted on other wiring boards (motherboards) and a method for fabrication thereof.

2. Description of Related Art

Since mobile information devices require miniaturized and high-density circuitry, miniaturized modules incorporated in such devices have to realize sophisticated functions within a space as small as possible. To achieve this, many modules are multichip modules in which, on a single module board provided with terminals for external connection, a core LSI (large-scale integration) chip is bare-chip mounted and various peripheral components are mounted. FIGS. 14 and 15 show an exemplary configuration of a multichip electronic circuit module 50 (hereinafter also referred to simply as a "module 50"). FIG. 14 is a vertical sectional view of the module 50 mounted on a motherboard 60, as seen on a plane perpendicular to the motherboard 60, and FIG. 15 is a perspective view showing only the single module 50 as seen from the bottom face thereof (the face in contact with the motherboard).

First, as shown in FIG. 14, on the front face of a multilayer module board 51 on which the module 50 is built, surface-mounted components such as peripheral chips 56, including a resistor or a capacitor, and an IC 57 in a general-purpose package are mounted by reflow soldering, for example. In this figure, these surface-mounted components are covered with a metal shield case 58.

On the other hand, as shown in FIG. 15, in the center of the bottom face of the module board 51, there is formed a quadrangular cavity 52, inside which a core LSI chip 53 is die-bonded in a bare-chip state. Connecting terminals on the LSI chip 53 are electrically connected to lands formed on the surface of the cavity 52 by wire bonding with gold wires 54. The cavity is then sealed with resin 55. JP-A-2003-060523 discloses the above-described configuration wherein, on the bottom face (the face in contact with the motherboard) of the module board 51, there is formed the cavity 52, inside which a semiconductor chip is provided.

Now, the module 50 as described above has electrode terminals (connecting terminals) 59 in peripheral portions around the cavity 52 formed on the bottom face of the module board 51. Through the electrode terminals 59, the module 50 is mounted on module-mounting lands 61 formed on the motherboard 60. Mounting is performed by such method as reflow soldering, whereby electrical connection with the outside of the module is established.

In many modules, the electrode terminals 59 are formed over the mutually continuous bottom and side faces of the module board 51. This is because it is thereby possible to form solder fillets (solder wicking portions) 62 (see FIG. 14) on the side faces of the module 50 that enhance soldering strength and allow the easy checking of solder connections.

Incidentally, the above-described electrode terminals 59 formed over the mutually continuous bottom and side faces of the module: board 51 are generally formed by the following method. As shown in FIG. 16, on cut margins 63 provided on a sheet circuit board 51a, which will eventually be cut into individual unit modules 50, through holes 64 having a width wider than that of the cut margins 63 are formed. Then, after the inner walls of the through holes 64 are plated with a conductive material, the cut margins 63 are cut away in such a way that the inner walls of the through holes 64 are left on the side faces of the module board 51.

Used as the above-described module board 51 having a cavity for fabrication of the module 50 is, in general, an LTCC (low temperature co-fired ceramic) board or a build-up multilayer board made of resin. In production of such a board, the employed method is laying thin layers one on top of another from which a portion corresponding to the cavity 52 is removed, or laying thin layers having no cavity 52 one on top of another, followed by the hollowing of the resultant layers to obtain the cavity 52. This makes production of such a board complicated as compared with a conventional flat multilayer board having no cavity, and thus leads to a longer production lead time and higher production cost.

Moreover, such a structure as that having a cavity has various structural limitations concerning, for example, the strength of the board or the interference between a device and the internal surfaces of the cavity 52 when the device is actually mounted inside the cavity 52. This limits module design flexibility.

As mentioned earlier, a plurality of unit module boards 51 are formed on a single sheet circuit board 51a, and then the sheet circuit board 51a is cut into individual unit module boards 51. In this case, however, the cavities 52 formed on one side of the sheet circuit board 51a cause warpage of the sheet circuit board 51a. This leads to lower dimensional accuracy of the cut module boards 51.

Furthermore, mounting of electronic components on the module board 51 has to be performed to the sheet circuit board 51a to improve the mounting efficiency and thereby reduce the production cost. However, the lower dimensional accuracy of the sheet circuit board 51a due to the warpage thereof just mentioned above makes it difficult to perform mounting to the sheet circuit board 51a. Thus, in most cases, the sheet circuit board 51a is cut into individual unit module boards 51, and then electronic components are mounted thereon. This is highly inefficient.

In addition to this, as described above, the connecting terminal 59 is formed over the mutually continuous bottom and side faces of the module board 51. This requires complicated process and thus leads accordingly to lower production efficiency.

In view of the conventionally experienced problems described above, it is an object of the present invention to provide a miniaturized electronic circuit module that does not suffer from the problems of the conventional miniaturized electronic circuit module having a cavity formed therein, and that can realize sophisticated functions within a space as small as possible, and to provide an efficient method for fabrication thereof.

SUMMARY OF THE INVENTION

To achieve the above object, according to the present invention, in an electronic circuit module provided with a board and an electronic component mounted on both faces of the board, the electronic component mounted on at least one face of the board is sealed to the board with resin applied thereto with a portion thereof exposed from the resin, and a part or the whole of the exposed portion serves as a connecting terminal to be electrically connected to the outside of the module.

With this construction, a flat board having no cavity can be used as the board (the module board) on which the electronic component is to be mounted.

In the construction described above, the portion serving as the connecting terminal to be electrically connected to the outside of the module may include mutually continuous two parts, one of which is a part parallel to the one face of the board and another of which is a part along a side face of the board. With this construction, by soldering the connecting terminal to the motherboard, a solder fillet is formed along a side face of the module other than a face thereof in contact with the motherboard.

In the construction described above, the electronic component having the portion serving as the connecting terminal to be electrically connected to the outside of the module may be electrically connected to the board by soldering. By doing so, it is possible to mount the electronic component serving as the connecting terminal on the module board in the same way that other surface-mounted components are mounted thereon.

In the construction described above, the electronic component having the portion serving as the connecting terminal to be electrically connected to the outside of the module may be a surface-mounted electronic component such as a chip capacitor, a chip resistor, or a chip inductor, and a part of an electrode portion of the surface-mounted electronic component may serve as the connecting terminal to be electrically connected to the outside of the module. With this construction, an element that is placed inside the module and is connected to a terminal if necessary and a component serving as a terminal can be formed integrally.

In the construction described above, the electronic component having the portion serving as the connecting terminal to be electrically connected to the outside of the module may be a metal block that has electrical conductivity and can be soldered.

The metal block may optionally have asperities formed on a portion thereof exposed from the resin for connection to the outside of the module. With this construction, it is possible to establish electrical connection by fitting these asperities to a terminal provided outside of the module.

Furthermore, the electronic component having the portion serving as the connecting terminal to be electrically connected to the outside of the module may be mounted on the both faces of the board.

According to the present invention, a method for fabricating the electronic circuit module described above is provided with the steps of: forming a plurality of modules on a sheet circuit board; on the sheet circuit board on which the plurality of modules are formed, mounting electronic components to be allocated to the entire area of the sheet circuit board; sealing the electronic components on the sheet circuit board with resin; curing the sealing resin; and cutting the sheet circuit board into individual unit modules.

In order that the electronic component having the connecting terminal to be electrically connected to the outside of the module is a metal block that has electrical conductivity and can be soldered and optionally that the metal block has asperities formed on a portion thereof exposed from the resin for connection to the outside of the module, the method, which already includes the steps of: forming a plurality of modules on a sheet circuit board; on the sheet circuit board on which the plurality of modules are formed, mounting electronic components to be allocated to the entire area of the sheet circuit board; sealing the electronic components on the sheet circuit board with resin; curing the sealing resin; and cutting the sheet circuit board into individual unit modules, may further include, when the sheet circuit board is cut into individual unit modules, the step of cutting off a portion of the metal block forming the connecting terminal to be electrically connected to the outside of the module, so that a resultant section of the metal block serves as an external connecting terminal or a part thereof.

According to the present invention constructed as described above, a flat board having no cavity can be used as a module board. As a result, as compared with the conventional board having a cavity, the occurrence of warpage of a sheet circuit board on which a plurality of modules are formed is suppressed. This makes it possible to mount all the electronic components on the sheet circuit board and thereby use a fabrication method in which the sheet circuit board is cut into individual unit modules. This helps realize accurate and efficient fabrication of an electronic circuit module and reduce the fabrication cost thereof.

The portion serving as the connecting terminal to be electrically connected to the outside of the module includes mutually continuous two parts, one of which is a part parallel to the one face of the board and another of which is a part along a side face of the board. As a result, when the connecting terminal is soldered to the motherboard, it is possible to increase the bonding strength between them, and allow the easy checking of the solder connections after mounting.

The electronic component having the portion serving as the connecting terminal to be electrically connected to the outside of the module is electrically connected to the module board by soldering. This makes it possible to mount the electronic component serving as the connecting terminal on the module board in the same way that other surface-mounted components are mounted thereon. This helps realize simultaneous mounting of the other surface-mounted components and thereby simplify the fabrication process.

The electronic component having the portion serving as the connecting terminal to be electrically connected to the outside of the module is a surface-mounted electronic component, and a part of an electrode portion of the surface-mounted electronic component serves as the connecting terminal to be electrically connected to the outside of the module. As a result, an element that is placed inside the module and is connected to a terminal if necessary and a component serving as a terminal can be formed integrally. This contributes to miniaturization of the module.

The electronic component having the portion serving as a connecting terminal to be electrically connected to the outside of the module is a metal block that has electrical conductivity and can be soldered. This helps provide a certain degree of design flexibility in choosing the size, shape, and material of the electrode terminal.

The metal block optionally has asperities formed on a portion thereof exposed from the resin for connection to the outside of the module. This makes it possible to establish electrical connection by fitting these asperities to a terminal provided outside of the module by an application of pressure. This eliminates the possibility of slippage that would occur with a terminal having a smooth surface, thereby enhancing the bonding strength. This helps achieve higher electrical reliability.

Furthermore, since the electronic component having the portion serving as the connecting terminal to be electrically connected to the outside of the module is mounted on the both sides of the board, it is possible to offer a wide range of variations in mounting arrangement of the module.

DETAILED DESCRIPTION OF PREFERRED EMBODIMENTS

Hereinafter, embodiments of the present invention will be described with reference to the accompanying drawings. It should be understood, however, that the embodiment presented below is simply intended to give an example of an electronic circuit module and a method for fabrication thereof that embody the technical idea of the present invention, and therefore the electronic circuit module and the method for fabrication thereof specifically described below are not intended to limit in any way the manner in which to carry out the present invention. That is, the present invention finds wide application in the technical fields to which the appended claims are directed.

First Embodiment

Figure 1:
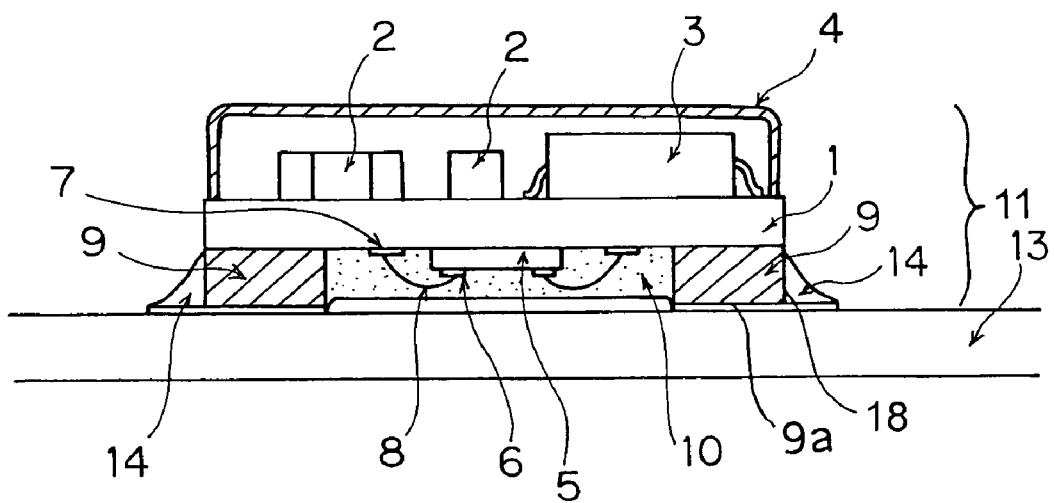
FIG. 1 is a schematic vertical sectional view of an electronic circuit module of a first embodiment of the present invention mounted on a motherboard, as seen on a plane perpendicular to the motherboard.
Figure 2:
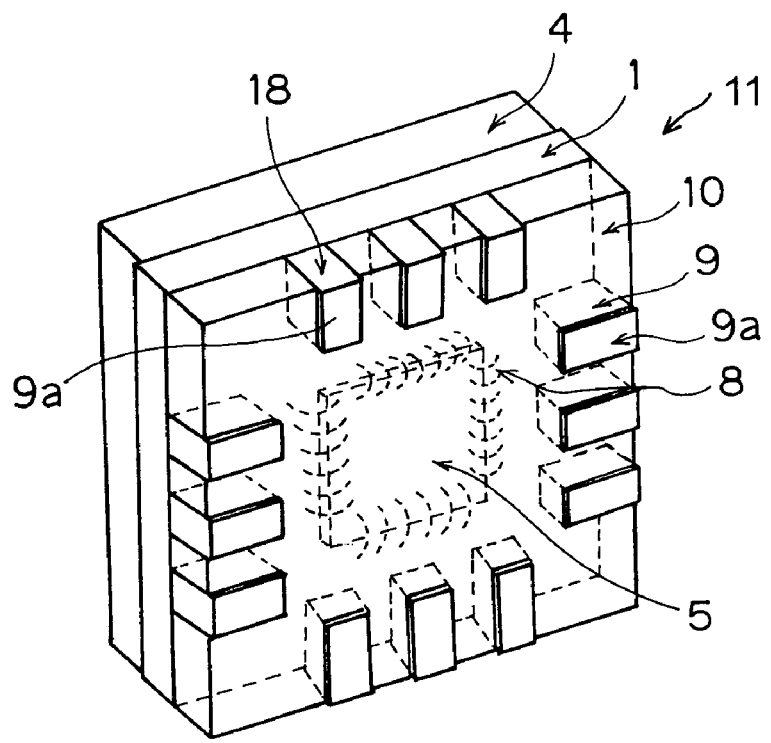
FIG. 2 is a schematic perspective view of a single electronic circuit module of the first embodiment, as seen from the bottom face thereof.

FIG. 1 is a vertical sectional view showing an electronic circuit module (hereinafter also referred to simply as the "module") 11 of a first embodiment of the present invention mounted on a motherboard 13, as seen on a plane perpendicular to the motherboard 13. FIG. 2 is a perspective view showing only the module 11 of FIG. 1 as seen from the bottom face thereof (the face in contact with the motherboard).

As shown in FIG. 1, the module 11 of this embodiment is built as follows. Surface-mounted chips 2 and an IC 3 in a small resin package are soldered to the front face of a 10-mm-square build-up resin 6-layer printed wiring board having a thickness of 0.5 mm, which serves as a module board 1.

Then, a shield case 4 made of a conductive thin metal sheet is attached to the ground terminal of the module board 1 with conductive resin in such a way that the surface-mounted chips 2 and the IC 3 are entirely covered therewith.

On the other hand, as shown in FIGS. 1 and 2, on the bottom face of the module board 1, an LSI chip 5 serving as a core of the module functions is die-bonded in a bare-chip state. Terminal pads 6 formed on the surface of the LSI chip 5 and wire pads 7 formed around the LSI chip 5 are connected to each other by wire bonding with gold wires 8.

Around the LSI chip 5, metal blocks 9 made of copper are soldered to the terminals formed on the module board 1.

The LSI chip 5, the gold wires 8, and the metal blocks 9 provided on the bottom face of the module board 1 are sealed with resin 10 with a motherboard-facing face 9a of each metal block 9 and a face 18 thereof flush with the corresponding side face of the module board 1 exposed from the resin 10. These exposed portions, i.e. the motherboard-facing faces 9a and the faces 18 flush with the corresponding side faces of the module board 1, serve as electrode terminals when the module 11 is soldered to the motherboard 13.

The exposed portions of the metal block 9, i.e. the motherboard-facing faces 9a and the faces 18 flush with the corresponding side faces of the module board 1, are formed over the mutually continuous bottom and side faces of the resin 10. Thus, by forming solder fillets 14 along the side faces of the module board 1, it is possible to increase the bonding strength between the module 11 and the motherboard 13, and allow the easy checking of the solder connections by examining the motherboard 13 from the front face side thereof.

The module board 1 used in this embodiment is a commonly-used flat board having no cavity, and thus can be produced with a simpler process and a shorter lead time than a board having a cavity. This also is advantageous in achieving higher cost performance.

Moreover, the absence of a cavity prevents the above-described problems from arising, such as the interference between the LSI chip 5 and the internal surfaces of a cavity when the LSI chip 5 is actually mounted inside the cavity, and permits the LSI chip 5 to be mounted without any positional restraints.

Figure 3:
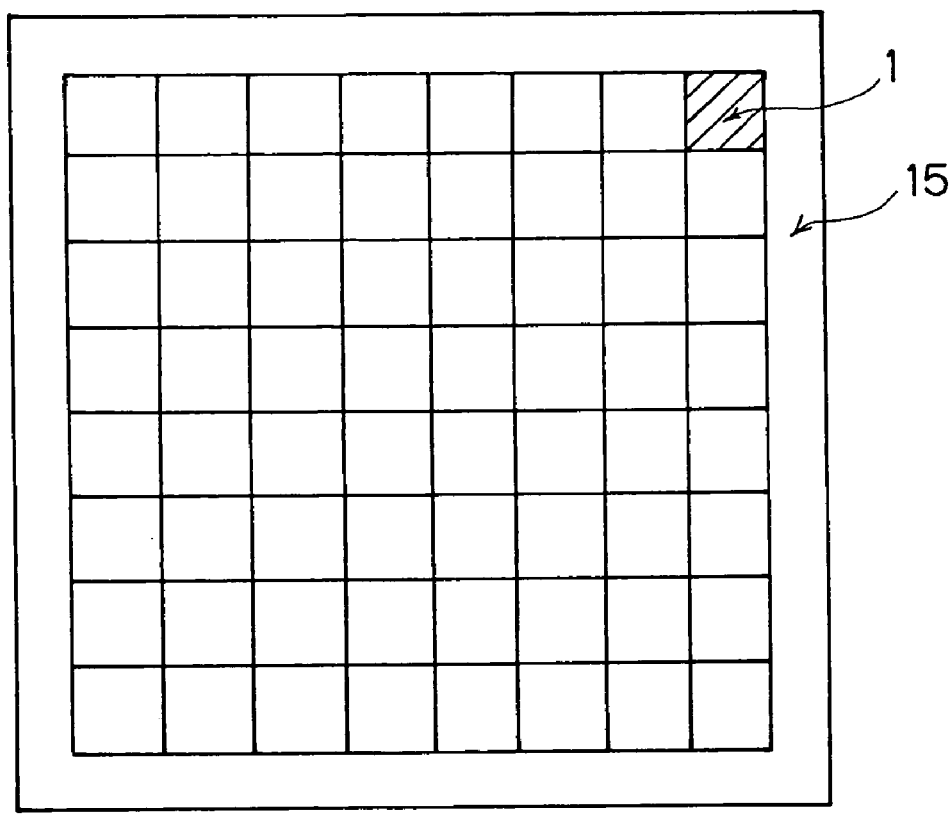
FIG. 3 is a schematic plan view of a sheet circuit board on which unit module boards of the first embodiment are formed in a matrix.

Furthermore, as compared with a case where a cavity exists, the occurrence of warpage of a sheet circuit board out of which the unit module board 1 is made is greatly suppressed. This makes it possible to collectively mount electronic components accurately on the sheet circuit board before it is cut into individual unit module boards 1, and achieve satisfactory dimensional accuracy of the cut unit module boards 1. This is the end of the description of the structure of the module 11 of this embodiment. In the following descriptions, a method for fabricating the module 11 of this embodiment will be described. The module board 1 of this embodiment is obtained by cutting the sheet circuit board 15 shown in FIG. 3 into individual unit module boards 1.

In the sheet circuit board 15 of this embodiment, the unit module boards 1 are formed in a matrix of 8×8. First, a soldering paste is printed on pads on which metal blocks are to be mounted, the pads being formed on the back of the sheet circuit board 15 around a portion of each unit module board 1 in which an LSI chip is to be mounted.

Next, the LSI chips 5 are die-bonded to the bottom face of the sheet circuit board 15, and are connected to the surrounding pads by wire bonding. Then, the metal blocks 9 are mounted on the pads on which the soldering paste is printed, the pads formed around each LSI chip 5. In this embodiment, used as the metal block 9 is a metal block having the shape of a rectangular parallelepiped and having the same size as a 1005-size chip capacitor (1.0 mm×0.5 mm×0.5 mm) according to JIS (Japanese Industrial Standards), and the metal blocks 9 are mounted with a commonly-used high-speed chip mounter. At the time of mounting of the metal blocks 9, each metal block 9 is mounted in such a way that it protrudes just 0.1 mm into a cut margin 16 in the direction along the longer sides of the metal block 9. After the metal blocks 9 are mounted, the sheet circuit board 15 is passed through a reflow furnace, so that the metal blocks 9 are soldered thereto.

Then, thermosetting resin 10 is applied to the face of the sheet circuit board 15 on which the LSI chips 5 and the metal blocks 9 are mounted, that is, the bottom face thereof, in sufficient thickness to completely cover the LSI chips 5 and the portions connected thereto by wire bonding, and cause the motherboard-facing faces 9a of the metal blocks 9 to be exposed from the resin. Finally, the thermosetting resin 10 is heated in an oven at the curing temperature to cure it.

After the resin applied to the back face of the sheet circuit board 15 is cured, a soldering paste is printed on pads on which electronic components are to be mounted, the pads being formed on the front face thereof. On the soldering paste thus printed, as shown in FIG. 1, the chip components 2, such as a chip capacitor, a chip resistor, or a chip inductor, and the IC 3 in a small resin package are mounted. Then, the sheet circuit board 15 thus obtained is passed through the reflow furnace again, so that the electronic components mounted on the front face thereof are soldered thereto.

Figure 4:
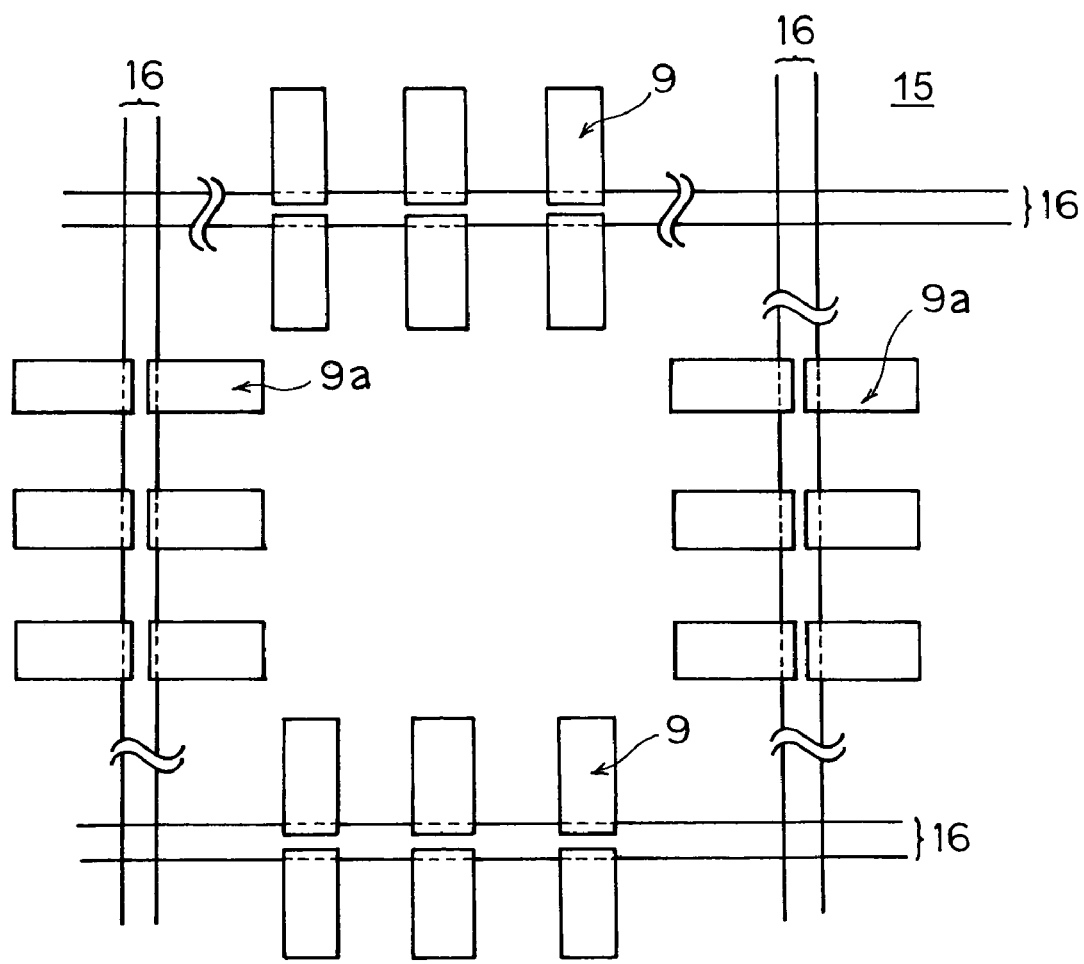
FIG. 4 is a schematic plan view showing how the unit module board of the first embodiment is cut out of the sheet circuit board.

After the electronic components mounted on the front face of the sheet circuit board 15 are soldered thereto, the sheet circuit board 15 is cut into individual unit modules 11 with a dicing machine. FIG. 4 is a schematic view showing how one unit module 11 is cut out of the sheet circuit board 15, as seen from the bottom face thereof. As shown in FIG. 4, in the sheet circuit board 15, the cut margins 16 having a width of 0.3 mm, which corresponds to the thickness of a dicing blade, are formed between the adjacent unit modules.

In the dicing process, the portions of the module board 1, the sealing resin, and the metal blocks 9 protruding into the cut margins 16 are collectively removed. As a result, as shown in FIG. 2, together with the motherboard-facing faces 9a of the metal blocks 9, the resultant sections (see FIGS. 1 and 2) flush with the corresponding side faces of the module board 1 form the electrode terminals of the electronic circuit module 11 for external connection.

Figure 16:
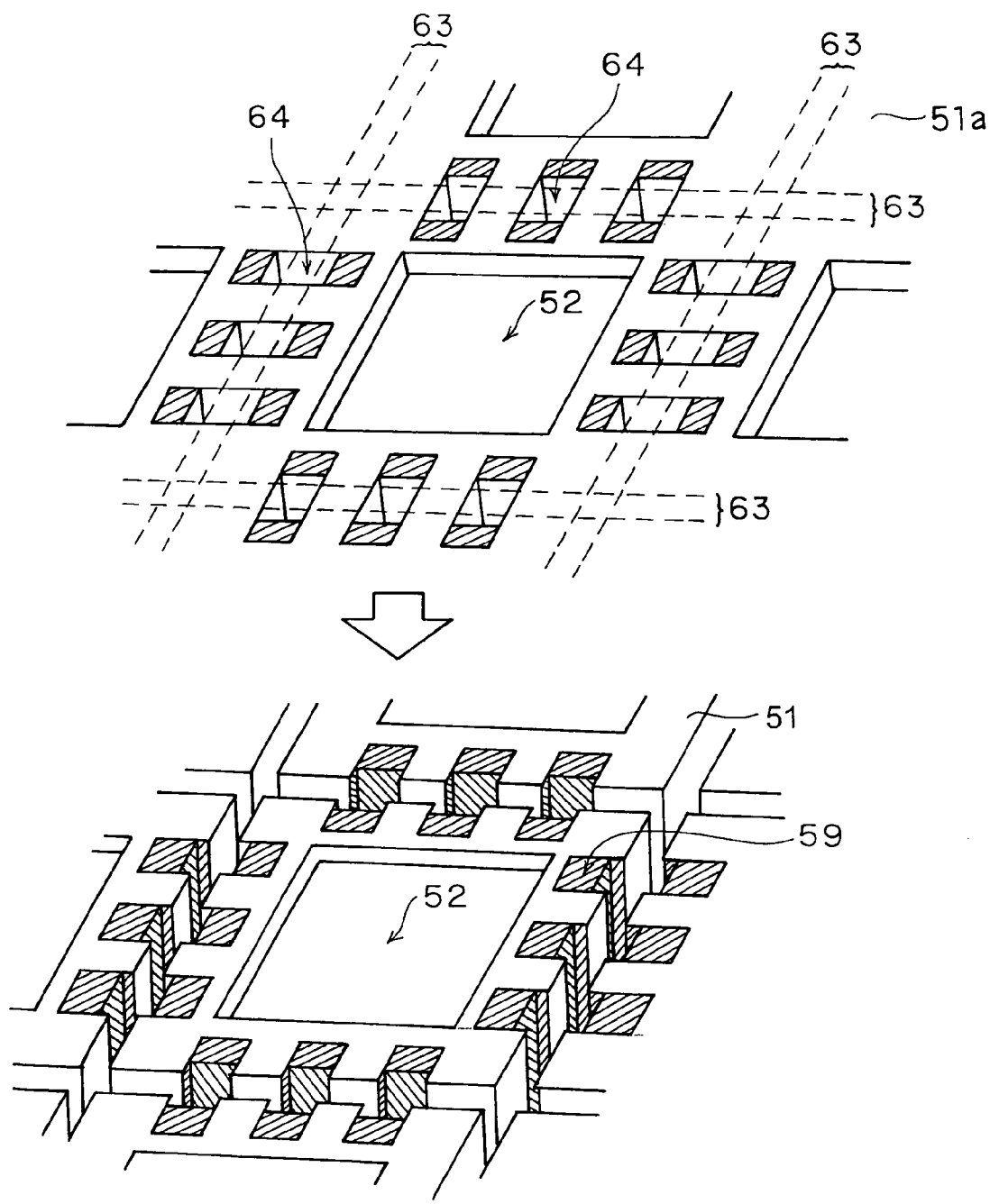
FIG. 16 is a schematic perspective view showing a part of a fabrication process of the conventional electronic circuit module.

As described above, unlike the conventional example, the fabrication method of the electronic circuit module 11 according to the present invention makes it possible to form the electrode terminals for external connection with a simple method as described above without employing an extra process such as forming through holes 64 along the cut margins 63 of the sheet circuit board 51a (see FIG. 16) and then plating the inside of the through holes 64.

Figure 5:
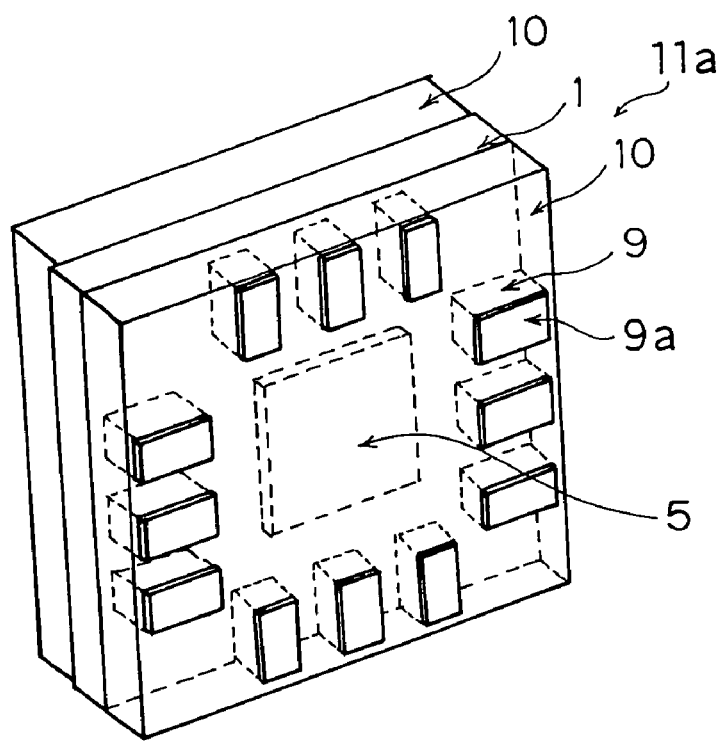
FIG. 5 is a schematic perspective view of a modified example of the single module of the first embodiment, as seen from the bottom face thereof.
Figure 6:
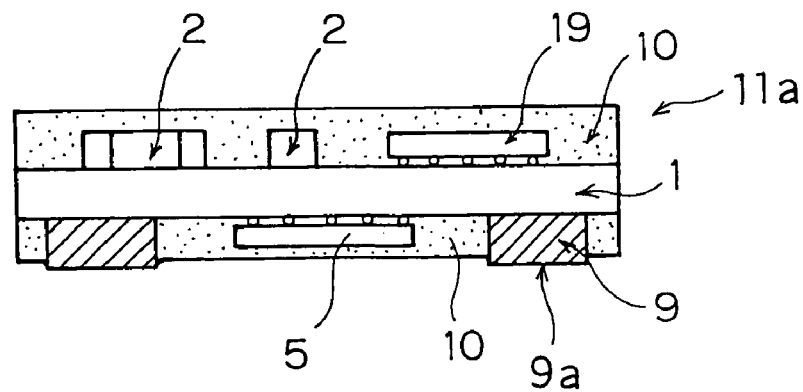
FIG. 6 is a schematic vertical sectional view of a modified example of the single module of the first embodiment, as seen on a plane perpendicular to the module board.

On the other hand, if it is preferable that a module be mounted without forming a fillet due to a limited space on the motherboard 13 in which the module is to be mounted, the first embodiment may be modified as shown in FIG. 5, where a module 11a has electrode terminals 9a exposed from the bottom face thereof and does not have them on the side faces thereof. Such a module 11a can be realized easily by mounting the metal blocks 9 in such a way that they do not protrude into the cut margins 16 (see FIG. 4) of the sheet circuit board 15. Incidentally, FIG. 6 is a vertical sectional view of the module 11a shown in FIG. 5, as seen on a plane perpendicular to the module board 1.

Finally, a metal shield case 4 is attached with a conductive adhesive to the front face of the unit module board 1 on which the electronic components are mounted. In this way, the module 11 of the first embodiment is finished.

The first embodiment described above deals with a case where the LSI, chip 5, which will be sealed with resin, is connected to the board by wire bonding. It is to be understood, however, that the LSI chip 5 may be mounted by flip chip bonding, as in the modified example shown in FIG. 5 or 6.

As is the case with the back face of the board 1, the electronic components mounted on the front face thereof may be sealed with resin, instead of being covered with the metal shield case 4. Obviously, many modifications and variations of the present invention are possible in light of the above teachings. For example, another LSI chip may be mounted on the front face of the board 1.

Second Embodiment

Figure 7:
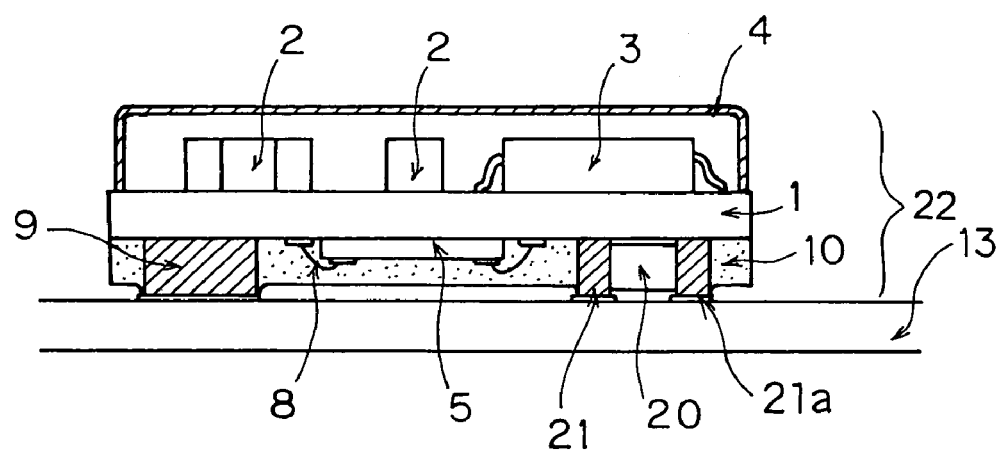
FIG. 7 is a schematic vertical sectional view of an electronic circuit module of a second embodiment of the present invention mounted on a motherboard, as seen on a plane perpendicular to the motherboard.
Figure 8:
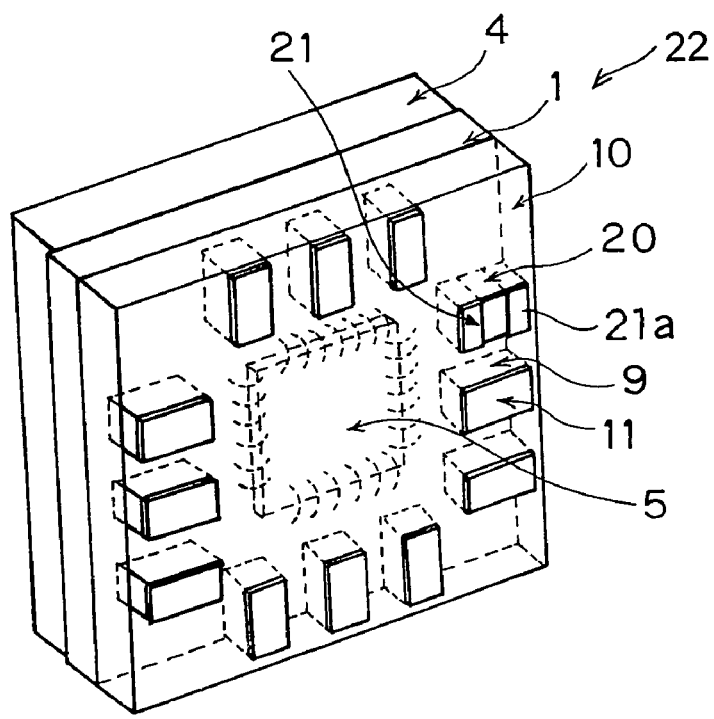
FIG. 8 is a schematic perspective view of the single electronic circuit module of the second embodiment, as seen from the bottom face thereof.

FIG. 7 is a vertical sectional view of an electronic circuit module (represented by reference numeral 22) of a second embodiment of the present invention, as seen on a plane perpendicular to a motherboard 13. FIG. 8 is a perspective view of the electronic circuit module (hereinafter also referred to simply as the "module") 22 from which the motherboard 13 is removed, as seen from the bottom face thereof. The module 22 of this embodiment differs from the modified example of the first embodiment in that a part of the metal blocks 9 forming the electrode terminals is replaced with a JIS-compliant 1005-size chip capacitor 20 having the same height as the metal block 9.

Figure 9:
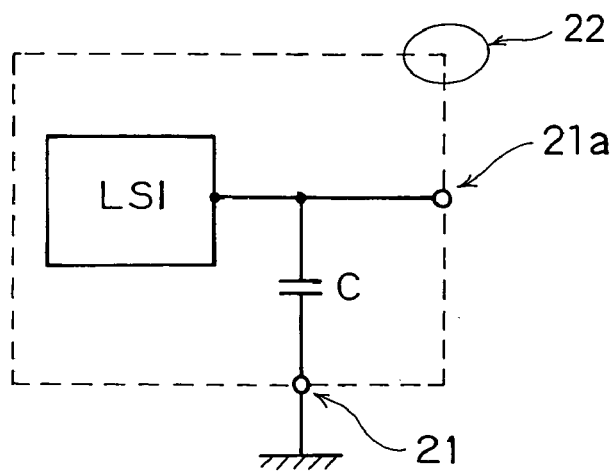
FIG. 9 is a circuit diagram showing the equivalent circuit of the electronic circuit module of the second embodiment.

The chip capacitor 20 has two electrode terminals exposed from the sealing resin, of which one is an electrode terminal 21 connected to a ground terminal and the other is an electrode terminal 21a connected to a signal terminal. In this way, the chip capacitor 20 serves as a capacitor in the circuit shown in FIG. 9.

The above-described module 22 of the second embodiment may be modified so that a part of the metal blocks 9 is replaced with a chip component having the same height as the metal block 9, such as a capacitor, a resistor, or an inductance, and lands formed on the motherboard 13 are accordingly rearranged so as to achieve a desired circuit configuration. By doing so, as is the case with the second embodiment, it is possible to incorporate a device connected to the electrode terminals 21 and 21a into the module.

Third Embodiment

Figure 10:
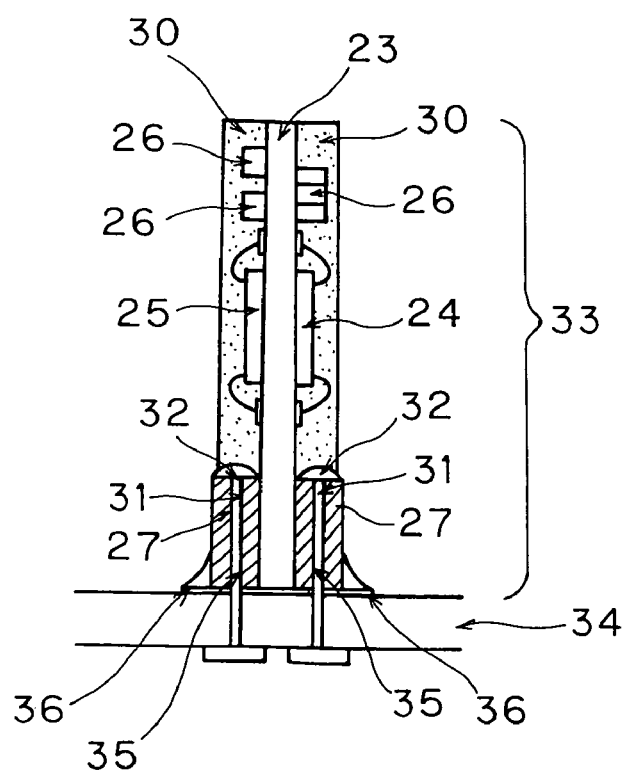
FIG. 10 is a schematic vertical sectional view of an electronic circuit module of a third embodiment of the present invention mounted on a motherboard, as seen on a plane perpendicular to the motherboard.
Figure 11:
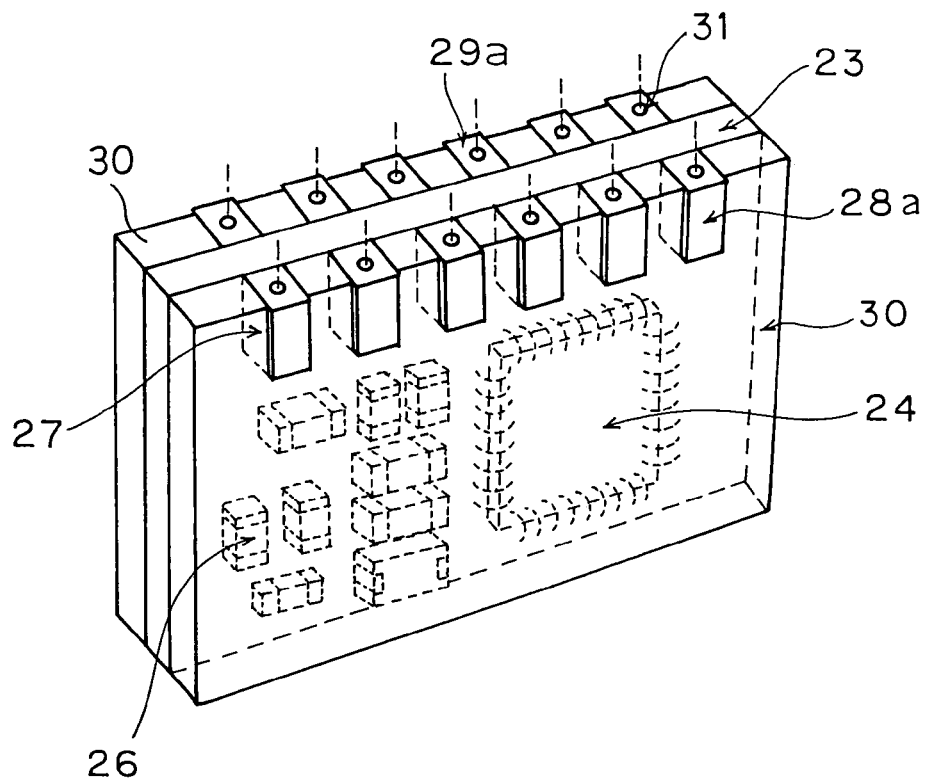
FIG. 11 is a schematic perspective view of the single module of the third embodiment, as seen from the bottom face thereof.

FIG. 10 is a vertical sectional view of an electronic circuit module (represented by reference numeral 33) of a third embodiment of the present invention, as seen on a plane perpendicular to a motherboard 34. FIG. 11 is a perspective view of the electronic circuit module 33 from which the motherboard 34 is removed, as seen from the bottom face thereof. As shown in these figures, in this embodiment, LSI chips 24 and 25 are bare-chip mounted on the front and bottom faces of a module board 23, and JIS-compliant 0603-size chip components 26 are mounted thereon by reflow soldering as components constituting the peripheral circuitry of the LSI chips 24 and 25.

As is the case with the first embodiment, on the front and back faces of the module board 23, a plurality of metal blocks 27 which are made of copper and have the same size as a commonly-used JIS-compliant 1005-size chip capacitor are mounted along the longer sides of the module board 23. As shown in FIGS. 10 and 11, these metal blocks 27 are sealed with resin 30 with a motherboard-facing face 29a and a side face 28a of each metal block 27 exposed from the resin 30.

Figure 12:
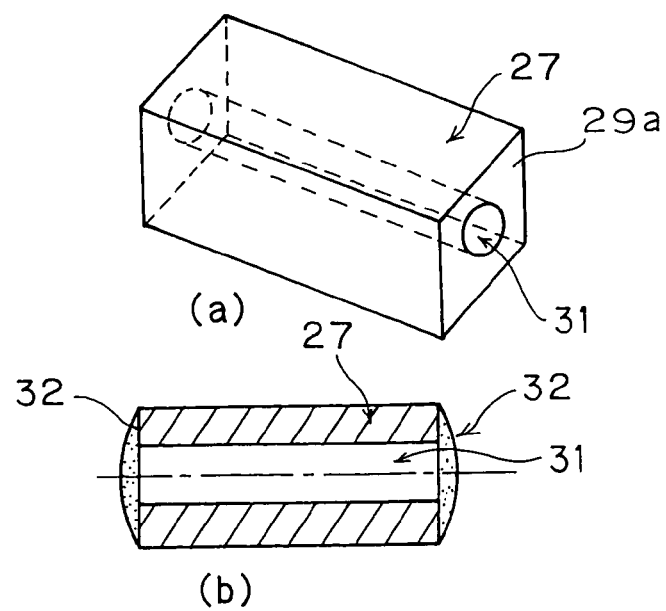
FIGS. 12(a) and 12(b) are diagrams showing a metal block to be incorporated in the third embodiment, FIG. 12(a) being a schematic perspective view thereof and FIG. 12(b) being a vertical sectional view with both ends thereof sealed with resin.

As shown in a perspective view of FIG. 12(*a*) and a vertical sectional view of FIG. 12(*b*), each metal block 27 has, on the motherboard-facing face 29a, a drilled hole 31 having a diameter of 0.4 mm and having an axis extending in the direction along the longer sides of the metal block 27. As will be described below, the drilled holes 31 are used for positioning the electronic circuit module 33 on the motherboard 34 by placing therethrough positioning pins 35 provided on the motherboard 34. Before the metal blocks 27 are mounted on the module board 23, epoxy resin 32 is applied to the drilled holes 31, so that they are blocked therewith. This epoxy resin 32 prevents, when the sealing resin 30 is applied after the metal block 27 are mounted on the module board 23, the sealing resin 30 thus applied from entering the drilled holes 31.

As shown in FIG. 10, the electronic circuit module 33 of this embodiment is positioned on the motherboard 34 by placing the pin terminals (the positioning pins 35) provided on the motherboard 34 through the drilled holes 31 of the electrode terminals, and is then soldered to a solder-connection land 36 formed around the pin terminals (the positioning pins 35). In this way, the electronic circuit module 33 is fixed to the motherboard 34.

Moreover, in this embodiment, each metal block 27 has unillustrated asperities formed on a face thereof exposed from the sealing resin 30, allowing the electronic circuit module 33 to be fittingly connected to an external terminal with these asperities by an application of pressure. This gives the electronic circuit module 33 greater connection strength than when it is provided with a terminal having a smooth surface, and enhances the reliability thereof. This is the end of the description of the structure of the electronic circuit module 33 of the third embodiment. In the following descriptions, a method for fabricating the electronic circuit module 33 of this embodiment will be described.

As is the case with the first embodiment, in the fabrication method of the electronic circuit module 33 of this embodiment, electronic components are mounted on a sheet circuit board and are then sealed with resin. Then, the resultant sheet circuit board is cut into individual unit modules.

Before the sheet circuit board is cut into individual unit modules, as is the case with the metal block 9 shown in FIG. 4 in the first embodiment, each metal block 27 is mounted in such a way that it protrudes into a cut margin at one end face thereof. When the sheet circuit board is cut with a dicing blade, the portions of the board, the sealing resin, the metal blocks 27, and the epoxy resin 32 applied to the end faces of the metal blocks 27, the portions overlapping with the cut margins, are collectively removed. In this way, the metal blocks 27 each having a drilled hole 31 at an end face thereof and serving as an external connecting terminal are formed.

Figure 13:
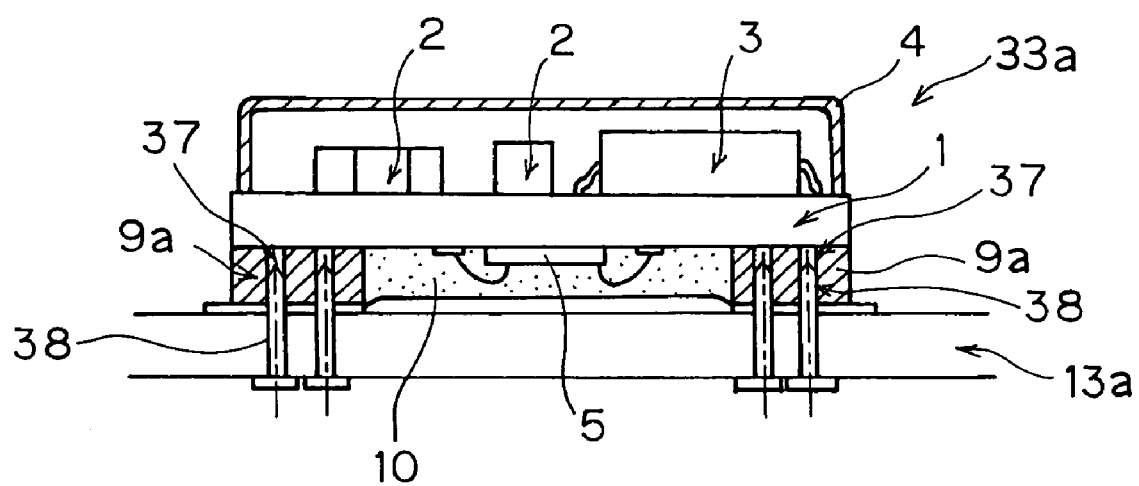
FIG. 13 is a schematic vertical sectional view of a modified example of the unit module of the third embodiment mounted on the motherboard, as seen on a plane perpendicular to the motherboard.
Figure 14:
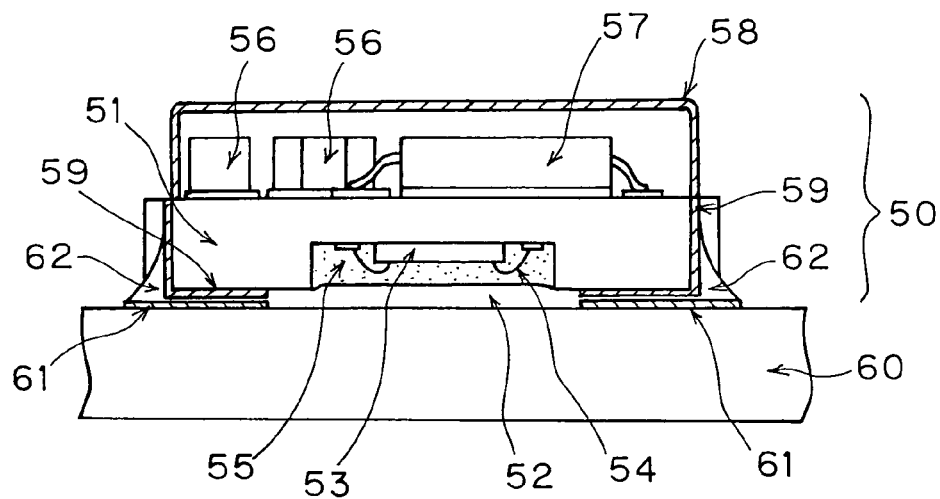
FIG. 14 is a schematic vertical sectional view of a conventional electronic circuit module mounted on a motherboard, as seen on a plane perpendicular to the motherboard.
Figure 15:
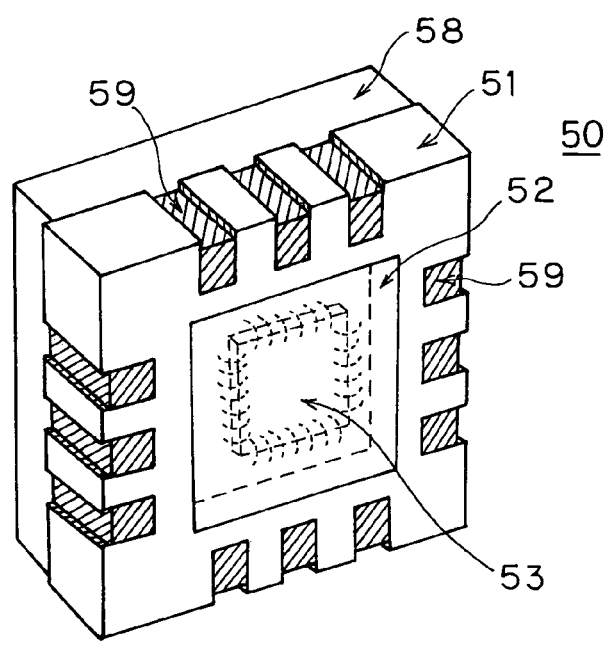
FIG. 15 is a schematic perspective view of the single conventional electronic circuit module as seen from the bottom face thereof.

This embodiment may be modified as shown in FIG. 13. As shown in this figure, an electronic circuit module represented by reference numeral 33a is provided with a metal block 9 having a drilled hole 37 formed in the back face thereof facing away from the board, and a motherboard 13a is provided with a pin terminal 38 that is to be placed through the drilled hole 37. That is, the module 33a can be fitted detachably to the motherboard 13a by placing the pin terminal 38 through the drilled hole 37, making it possible to provide a reliable connection between them without soldering. This contributes to simplification of the fabrication process and thus to cost reduction.

What is claimed is:

1. An electronic circuit module comprising a board and an electronic component mounted on both faces of the board, wherein the electronic component mounted on at least one face of the board is sealed to the board with resin applied thereto with a portion thereof exposed from the resin, and a part or a whole of the exposed portion serves as a connecting terminal to be electrically connected to an outside of the module.

2. The electronic circuit module of claim 1, wherein the portion serving as the connecting terminal to be electrically connected to the outside of the module includes mutually continuous two parts, one of which is a part parallel to the one face of the board and another of which is a part along a side face of the board.

3. The electronic circuit module of claim 1 wherein the electronic component having the portion serving as the connecting terminal to be electrically connected to the outside of the module is electrically connected to the board by soldering.

4. The electronic circuit module of claim 1, wherein the electronic component having the portion serving as the connecting terminal to be electrically connected to the outside of the module is a surface-mounted electronic component such as a chip capacitor, a chip resistor, or a chip inductor, and a part of an electrode portion of the surface-mounted electronic component serves as the connecting terminal to be electrically connected to the outside of the module.

5. The electronic circuit module of claim 1, wherein the electronic component having the portion serving as the connecting terminal to be electrically connected to the outside of the module is a metal block that has electrical conductivity and can be soldered.

6. The electronic circuit module of claim 1, wherein the electronic component having the portion serving as the connecting terminal to be electrically connected to the outside of the module is mounted on the both faces of the board.

7. A method for fabricating an electronic circuit module of claim 1, comprising the steps of:
forming a plurality of modules on a sheet circuit board;
on the sheet circuit board on which the plurality of modules are formed, mounting electronic components to be allocated to an entire area of the sheet circuit board;
sealing the electronic components on the sheet circuit board with resin;
curing the sealing resin; and
cutting the sheet circuit board into individual unit modules.

8. The electronic circuit module of claim 2, wherein
the electronic component having the portion serving as the connecting terminal to be electrically connected to the outside of the module is electrically connected to the board by soldering.

9. The electronic circuit module of claim 2, wherein
the electronic component having the portion serving as the connecting terminal to be electrically connected to the outside of the module is a surface-mounted electronic component such as a chip capacitor, a chip resistor, or a chip inductor, and
a part of an electrode portion of the surface-mounted electronic component serves as the connecting terminal to be electrically connected to the outside of the module.

10. The electronic circuit module of claim 2, wherein
the electronic component having the portion serving as the connecting terminal to be electrically connected to the outside of the module is a metal block that has electrical conductivity and can be soldered.

11. The electronic circuit module of claim 2, wherein
the electronic component having the portion serving as the connecting terminal to be electrically connected to the outside of the module is mounted on the both faces of the board.

12. A method for fabricating an electronic circuit module of claim 2, comprising the steps of:
forming a plurality of modules on a sheet circuit board;
on the sheet circuit board on which the plurality of modules are formed, mounting electronic components to be allocated to an entire area of the sheet circuit board;
sealing the electronic components on the sheet circuit board with resin;
curing the sealing resin; and
cutting the sheet circuit board into individual unit modules.

13. The electronic circuit module of claim 3, wherein
the electronic component having the portion serving as the connecting terminal to be electrically connected to the outside of the module is a surface-mounted electronic component such as a chip capacitor, a chip resistor, or a chip inductor, and
a part of an electrode portion of the surface-mounted electronic component serves as the connecting terminal to be electrically connected to the outside of the module.

14. The electronic circuit module of claim 3, wherein
the electronic component having the portion serving as the connecting terminal to be electrically connected to the outside of the module is a metal block that has electrical conductivity and can be soldered.

15. The electronic circuit module of claim 3, wherein
the electronic component having the portion serving as the connecting terminal to be electrically connected to the outside of the module is mounted on the both faces of the board.

16. A method for fabricating an electronic circuit module of claim 3, comprising the steps of:
forming a plurality of modules on a sheet circuit board;
on the sheet circuit board on which the plurality of modules are formed, mounting electronic components to be allocated to an entire area of the sheet circuit board;
sealing the electronic components on the sheet circuit board with resin;
curing the sealing resin; and
cutting the sheet circuit board into individual unit modules.

17. The electronic circuit module of claim 4, wherein
the electronic component having the portion serving as the connecting terminal to be electrically connected to the outside of the module is mounted on the both faces of the board.

18. A method for fabricating an electronic circuit module of claim 4, comprising the steps of:
forming a plurality of modules on a sheet circuit board;
on the sheet circuit board on which the plurality of modules are formed, mounting electronic components to be allocated to an entire area of the sheet circuit board;
sealing the electronic components on the sheet circuit board with resin;
curing the sealing resin; and
cutting the sheet circuit board into individual unit modules.

19. The electronic circuit module of claim 5, wherein
the metal block has asperities formed on a portion thereof exposed from the resin for connection to the outside of the module.

20. The electronic circuit module of claim 5, wherein
the electronic component having the portion serving as the connecting terminal to be electrically connected to the outside of the module is mounted on the both faces of the board.

21. A method for fabricating an electronic circuit module of claim 5, comprising the steps of:
forming a plurality of modules on a sheet circuit board;
on the sheet circuit board on which the plurality of modules are formed, mounting electronic components to be allocated to an entire area of the sheet circuit board;
sealing the electronic components on the sheet circuit board with resin;
curing the sealing resin; and
cutting the sheet circuit board into individual unit modules.

22. A method for fabricating an electronic circuit module of claim 5, comprising the steps of:
forming a plurality of modules on a sheet circuit board;
on the sheet circuit board on which the plurality of modules are formed, mounting electronic components to be allocated to an entire area of the sheet circuit board;
sealing the electronic components on the sheet circuit board with resin;
curing the sealing resin; and
cutting the sheet circuit board into individual unit modules, wherein when the sheet circuit board is cut into individual unit modules, a portion of the metal block forming the connecting terminal to be electrically connected to the outside of the module is cut off, so that a resultant section of the metal block serves as an external connecting terminal or a part thereof.

23. A method for fabricating an electronic circuit module of claim 6, comprising the steps of:

forming a plurality of modules on a sheet circuit board;

on the sheet circuit board on which the plurality of modules are formed, mounting electronic components to be allocated to an entire area of the sheet circuit board;

sealing the electronic components on the sheet circuit board with resin;

curing the sealing resin; and cutting the sheet circuit board into individual unit modules.

24. The electronic circuit module of claim 19, wherein the electronic component having the portion serving as the connecting terminal to be electrically connected to the outside of the module is mounted on the both faces of the board.

25. A method for fabricating an electronic circuit module of claim 19, comprising the steps of:

forming a plurality of modules on a sheet circuit board;

on the sheet circuit board on which the plurality of modules are formed, mounting electronic components to be allocated to an entire area of the sheet circuit board;

sealing the electronic components on the sheet circuit board with resin;

curing the sealing resin; and cutting the sheet circuit board into individual unit modules.

26. A method for fabricating an electronic circuit module of claim 19, comprising the steps of:

forming a plurality of modules on a sheet circuit board;

on the sheet circuit board on which the plurality of modules are formed, mounting electronic components to be allocated to an entire area of the sheet circuit board;

sealing the electronic components on the sheet circuit board with resin;

curing the sealing resin; and cutting the sheet circuit board into individual unit modules, wherein when the sheet circuit board is cut into individual unit modules, a portion of the metal block forming the connecting terminal to be electrically connected to the outside of the module is cut off, so that a resultant section of the metal block serves as an external connecting terminal or a part thereof.

* * * * *